United States Patent
Shin et al.

(10) Patent No.: US 7,463,106 B2
(45) Date of Patent: Dec. 9, 2008

(54) PUSH-PUSH VOLTAGE CONTROLLED OSCILLATOR FOR OBTAINING DIFFERENTIAL SIGNALS

(75) Inventors: Hyun-Chol Shin, Seoul (KR); Hyun Kim, Seoul (KR)

(73) Assignee: Industry-Academic Cooperation Foundation - Yonsei University, Seodaemun-Gu, Seoul (KR)

( * ) Notice: Subject to any disclaimer, the term of this patent is extended or adjusted under 35 U.S.C. 154(b) by 42 days.

(21) Appl. No.: 11/404,134

(22) Filed: Apr. 14, 2006

(65) Prior Publication Data
US 2007/0182502 A1 Aug. 9, 2007

(30) Foreign Application Priority Data
Feb. 8, 2006 (KR) .................. 10-2006-0012166

(51) Int. Cl.
*H03B 5/08* (2006.01)
(52) U.S. Cl. .................. 331/167; 331/117 FE; 331/182
(58) Field of Classification Search .............. 331/36 C, 331/36 L, 45, 108 R, 117 FE, 108 A, 108 C, 331/167, 185, 117 R
See application file for complete search history.

(56) References Cited

U.S. PATENT DOCUMENTS

| | | | |
|---|---|---|---|
| 6,680,655 B2 * | 1/2004 | Rogers | 331/109 |
| 6,680,657 B2 * | 1/2004 | Wang et al. | 331/177 V |
| 6,750,727 B1 * | 6/2004 | Sutardja | 331/117 R |
| 6,765,448 B2 * | 7/2004 | Wu et al. | 331/117 FE |
| 7,250,826 B2 * | 7/2007 | Gabara | 331/117 R |

FOREIGN PATENT DOCUMENTS

KR 1020020095618 A 12/2002

OTHER PUBLICATIONS

Office Action issued by the Korean Intellectual Property Office in priority Application No. 10-2006-0012166 (with English translation) (8 pages).
A.K. Kassim et al., "Tail Current Flicker Noise Reduction in LC VCOs by Complementary Switched Biasing", ICM 2003, Dec. 9-11, 2003, pp. 102-105.

\* cited by examiner

*Primary Examiner*—Robert Pascal
*Assistant Examiner*—Ryan J. Johnson
(74) *Attorney, Agent, or Firm*—Sheridan Ross P.C.

(57) ABSTRACT

Disclosed is a push-push voltage controlled oscillator which obtains output signals having a frequency two times the fundamental resonance frequency of an LC resonator with differential signals having the same amplitude and opposite phases, creating the advantage of high frequency differential outputs which are obtained using such a voltage controlled oscillator, and thus reducing current consumption.

3 Claims, 17 Drawing Sheets

PRIOR ART

PRIOR ART

PUSH-PUSH VOLTAGE CONTROLLED OSCILLATOR FOR OBTAINING DIFFERENTIAL SIGNALS

BACKGROUND OF THE INVENTION

1. Field of the Invention

The present invention relates generally to a voltage controlled oscillator for a Radio Frequency (RF) integrated circuit and, more particularly, to a push-push voltage controlled oscillator that can obtain output signals having a frequency twice as high as the fundamental resonance frequency of an LC resonator with differential signals having the same amplitude and opposite phases.

2. Description of the Related Art

Recently, markets for mobile communication terminals that not only operate in several frequency bands but also have various functions have developed domestically and abroad.

Therefore, mobile communication terminals are being miniaturized in order to satisfy the demand of consumers, the parts of mobile communication terminals are being miniaturized, and the various parts of the RF system are also being miniaturized.

Particularly, in order to implement a transceiver for high frequency communication, an oscillator having a high output frequency, low phase noise and low power consumption is essential. Generally, inductors and capacitors, which are components constituting the LC resonator, must be physically miniaturized in order to make an oscillator with an LC resonator to oscillate in a high (radio) frequency band. Since it is known that, as elements become smaller, the errors of the elements increase, and there is a strong possibility that the error between a design frequency value and a manufacturing frequency value increases as the operating frequency of an oscillator increases.

In order to solve this problem a method of using a separate frequency doubler or a separate frequency multiplier in a voltage controlled oscillator is used for acquiring a high output frequency. However, this method has a problem in that an additional circuit is required and current consumption increases.

Another method of increasing an output frequency is based on the structure of a push-push voltage controlled oscillator. This structure is constructed so as to combine two outputs from two balanced oscillators at one point and thus obtain a doubled output frequency.

Meanwhile, it is known that differential signal processing is superior to single-ended signal processing in order to efficiently eliminate common-mode noise in an RF/analog Integrated Circuit (RFIC) and, thus, achieving signal processing resistant to noise. Therefore, RF/analog integrated circuit designers demand circuit structures capable of generating or processing differential signals. However, a conventional push-push voltage controlled oscillator generally generates only single ended output.

Accordingly, in order to acquire differential signals, an additional circuit, such as a single-to-differential converter, must be further included.

As illustrated in FIG. 1, a frequency doubler, which generates differential signals, includes a power supply (VDD), transistors $M_1$, $M_2$, $M_3$ and $M_4$, impedance elements $L_P$ and $L_M$, a non-inverted input signal $V_{in}^+$, an inverted input signal $V_{in}^-$, and a ground terminal. Using this, differential signals composed of fundamental frequency components, which are generated by a voltage-controlled oscillator, can be converted into differential signals each having a doubled frequency. However, there is a problem in that an additional circuit, called a differential frequency doubler, is required which results in an increase in circuit complexity and power consumption.

Furthermore, in order to acquire a high frequency within a voltage-controlled oscillator without additionally using a frequency doubler, a push-push voltage-controlled oscillator may be used. The push-push voltage-controlled oscillator has an efficient structure capable of obtaining a frequency twice as high as a fundamental operating frequency. This has advantages in that current consumption is less than that in a general structure, and when it is applied to a direct conversion type RF transceiver, the undesired pulling problem experienced with a voltage-controlled oscillator decreases. As a result, the push-push voltage-controlled oscillator structure is widely used in a Si RF integrated circuit or a compound semiconductor Monolithic Microwave Integrated Circuit (MMIC). As illustrated in FIG. 2, the structure of a conventional push-push voltage-controlled oscillator includes an LC resonator which includes an inductor $L_{tank}$ and variable capacitance diodes $C_{tank}$, and determines a fundamental oscillation frequency, and a transistor pair M1 and M2 which generates negative resistance in order to compensate for the loss of the LC resonator, thereby outputting a doubled frequency at a common source terminal M. In this case, in order to increase the amplitude of the output signal, an impedance element is provided to the common source terminal M. However, the structure has a problem in that there is only one output signal. As described above, a single signal is very sensitive to external noise, so that it is difficult to apply it directly to an RF integrated circuit.

SUMMARY OF THE INVENTION

Accordingly, the present invention has been made keeping in mind the above problems occurring in the prior art, and an object of the present invention is to provide a push-push voltage-controlled oscillator which can decrease current consumption by not using an additional circuit for acquiring a high frequency, and generate differential signals having a frequency twice as high as a fundamental resonance frequency.

In order to accomplish the above objectives, the present invention provides a push-push voltage controlled oscillator, including an LC resonance unit for determining a fundamental oscillation frequency; a first negative resistance generation means connected to the LC resonance unit and configured to generate negative resistance and deliver an output signal to a first common source terminal; a first impedance element for controlling an output signal of the first common source terminal; a second negative resistance generation means connected to the LC resonance unit and configured to generate negative resistance and deliver an output signal to a second common source terminal; and a second impedance element for controlling an output signal of the second common source terminal.

The LC resonance unit according to the present invention determines a fundamental oscillation frequency, and may be implemented using any device that performs this task, preferably inductors and variable capacitance diodes.

The first negative resistance generation means according to the present invention is connected to the LC resonance unit, generates negative resistance, and delivers an output signal to the first common source terminal. The negative resistance generation means may be any device that performs this task, preferably transistors, more preferably MOS FETs manufactured through a Si CMOS process, more particularly a differential transistor pair in which PMOS FET pairs are cross-connected.

The first impedance element according to the present invention is connected to the first common source terminal, controls the output signal of the first common source terminal, and may be implemented using any output signal control means used in the art, preferably a resistor, a transistor, an inductor or the combination of two or more of them, more preferably an inductor.

The second negative resistance generation means according to the present invention is connected to the LC resonance unit, generates negative resistance, and delivers an output signal to the second common source terminal. The negative resistance generation means may be any resistance generation means that performs this task, preferably transistors, more preferably MOS FETs manufactured through Si CMOS process, more particularly a differential transistor pair in which NMOS FET pairs are cross-connected.

The second impedance element according to the present invention is connected to the second common source terminal, controls the output signal of the second common source terminal, and may be implemented using a resistor, a transistor, an inductor or the combination of two or more of them, preferably the same as the first impedance element.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
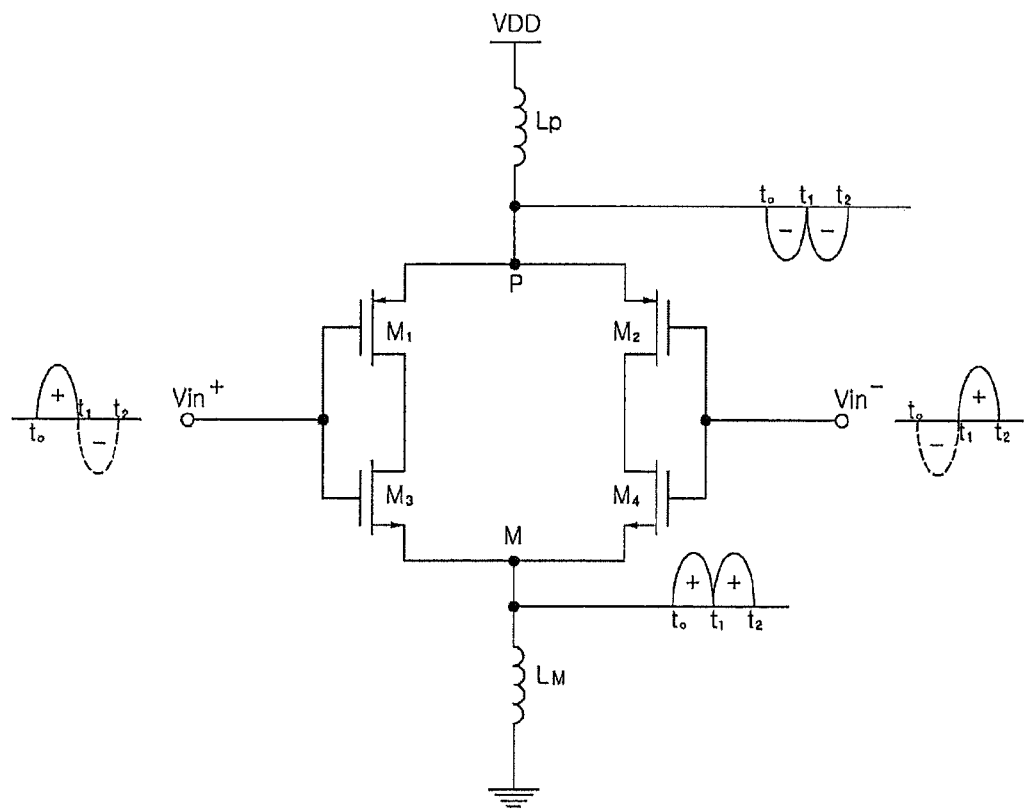
FIG. 1 is a circuit diagram illustrating a conventional frequency doubler for generating differential signals.
Figure 2:
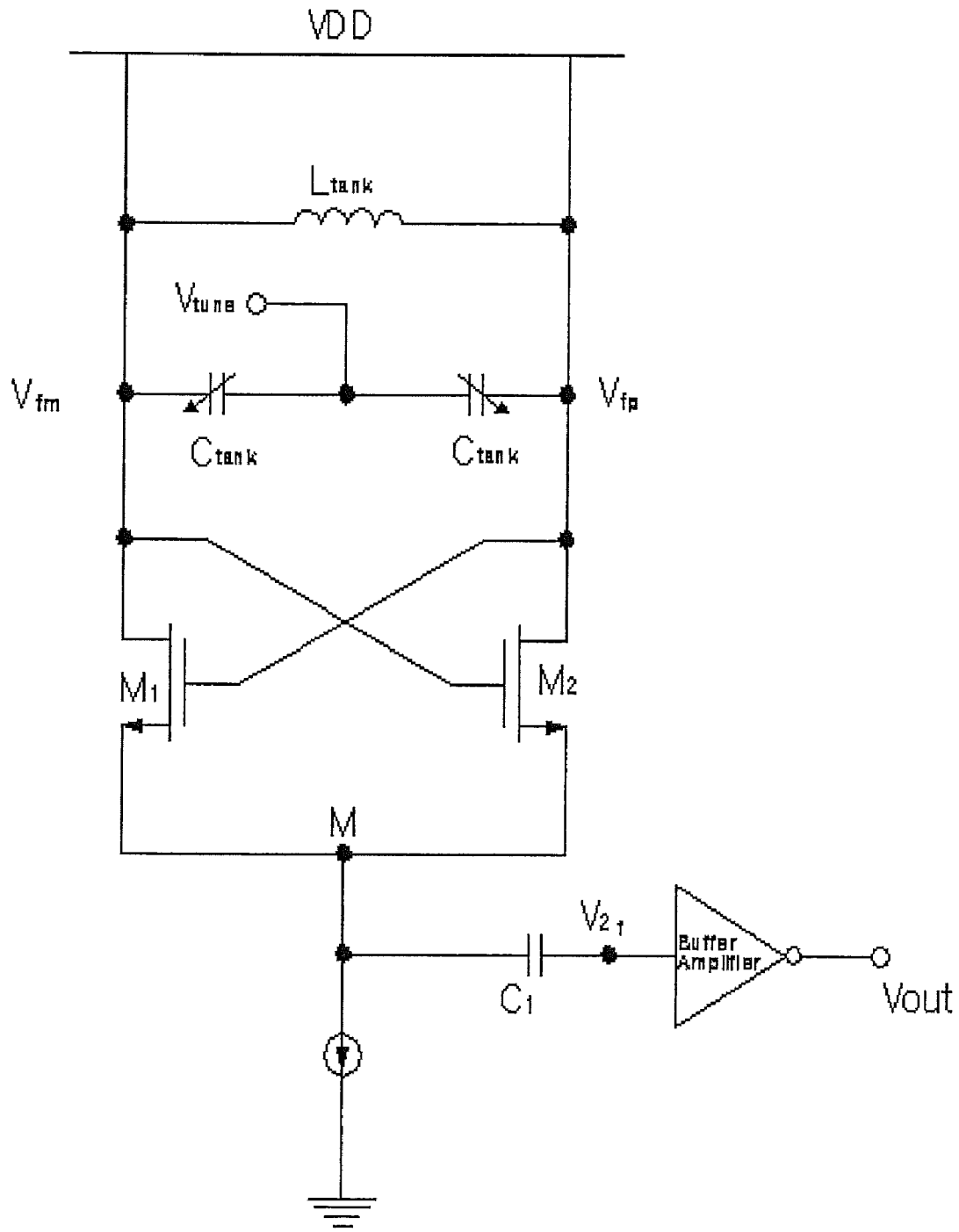
FIG. 2 is a diagram illustrating the structure of a conventional push-push voltage controlled oscillator.

Reference should now be made to the drawings, in which the same reference numerals are used throughout the different drawings to designate the same or similar components.

Figure 3A:
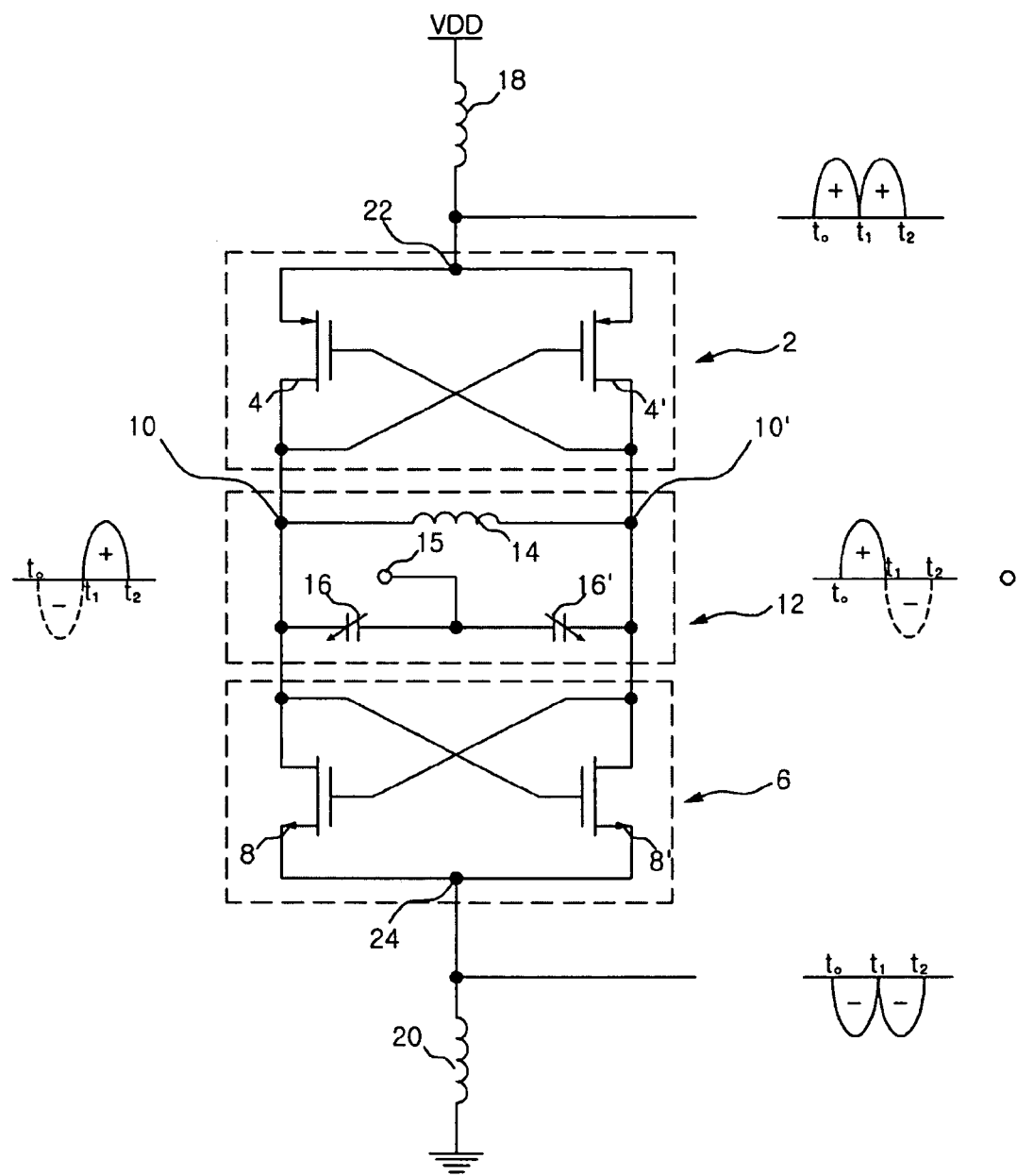
FIGS. 3A and 3B are diagrams illustrating the structure of a push-push voltage controlled oscillator according to the present invention.
Figure 3B:
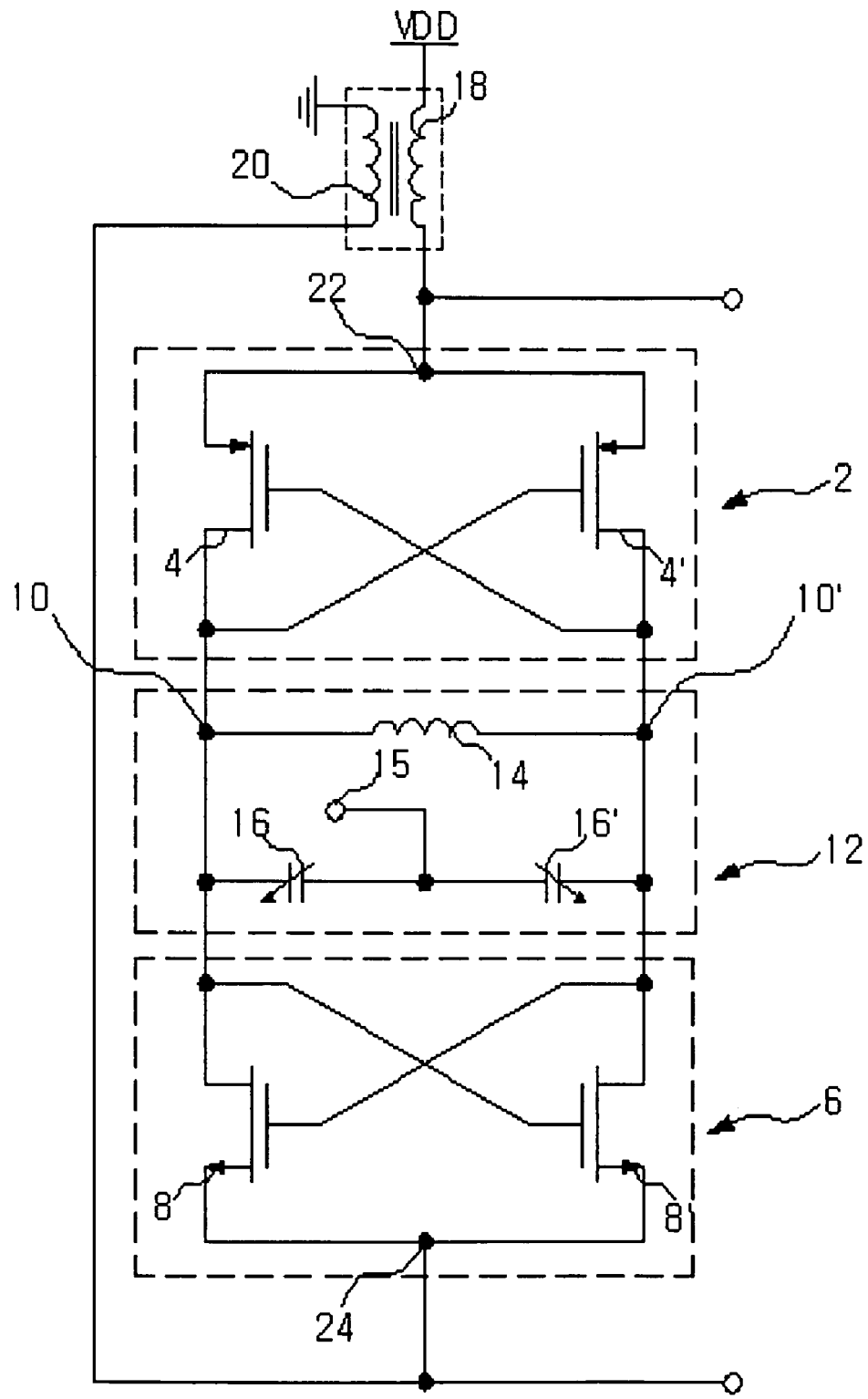
Figure 4A:
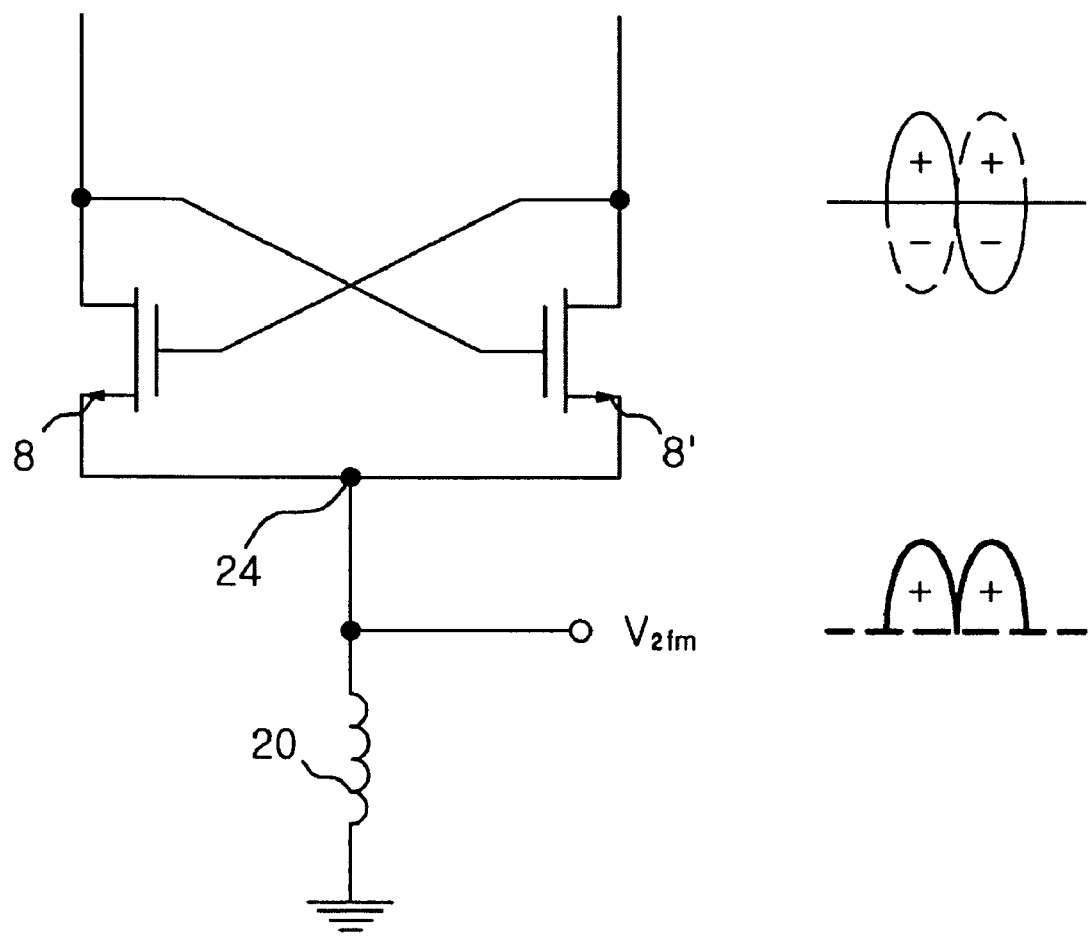
FIGS. 4A and 4B are diagrams illustrating conceptual operation and simulated signal waveforms when the tank swing of the push-push voltage controlled oscillator according to the present invention is small, respectively.
Figure 4B:
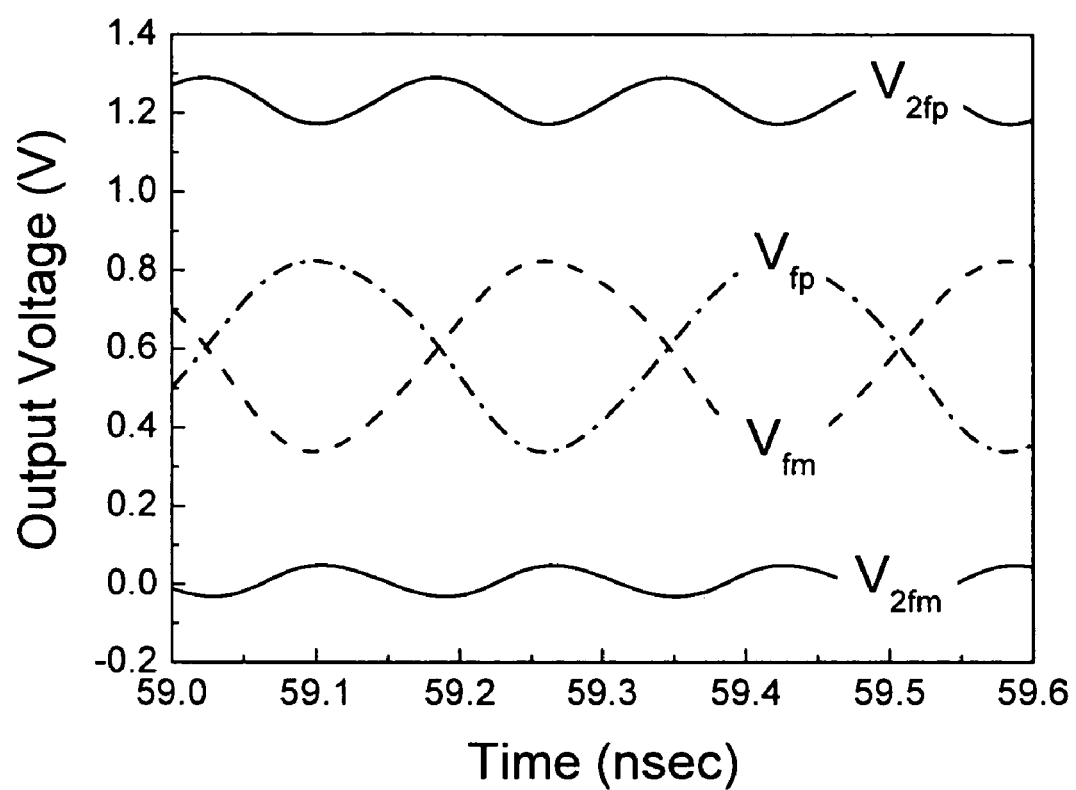
Figure 5A:
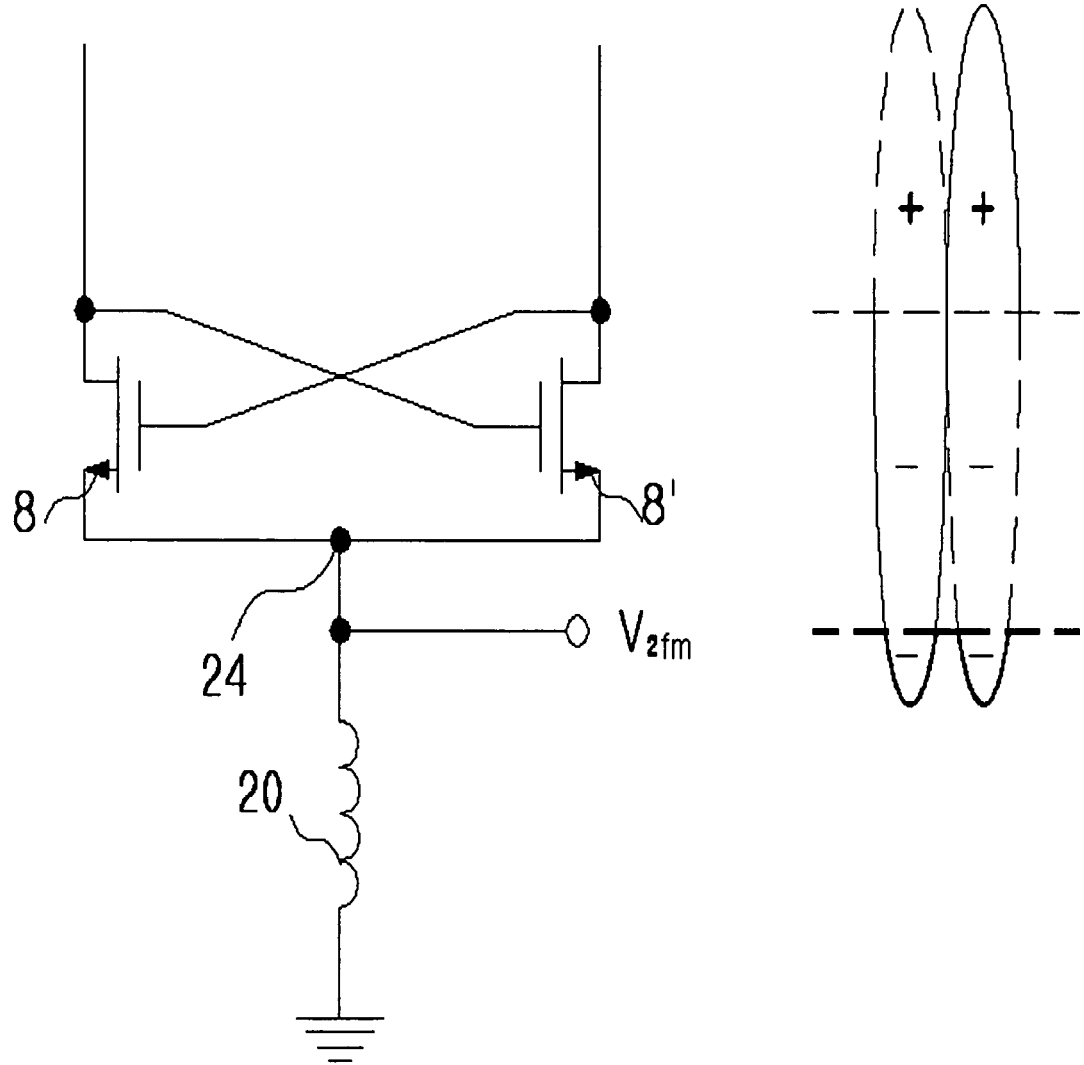
FIGS. 5A and 5B are diagrams illustrating conceptual operation, and simulated signal waveforms, when the tank swing of the push-push voltage controlled oscillator according to the present invention is large, respectively.
Figure 5B:
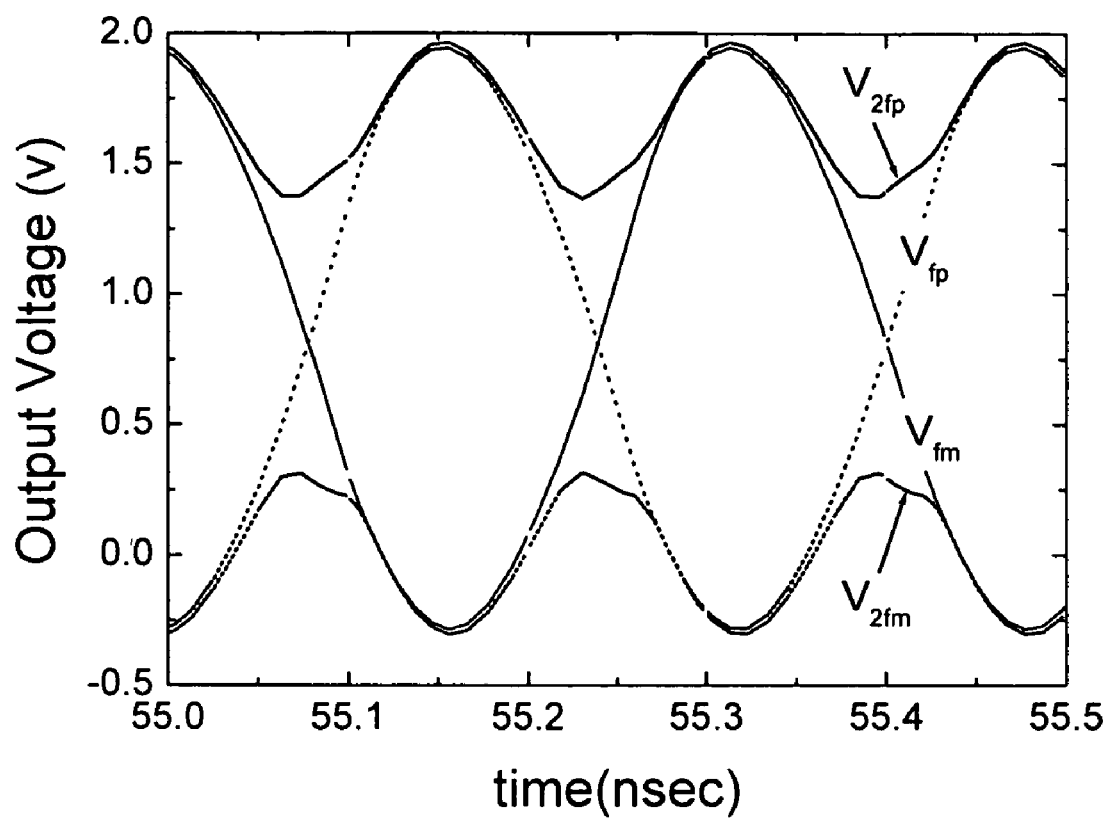
Figure 6:
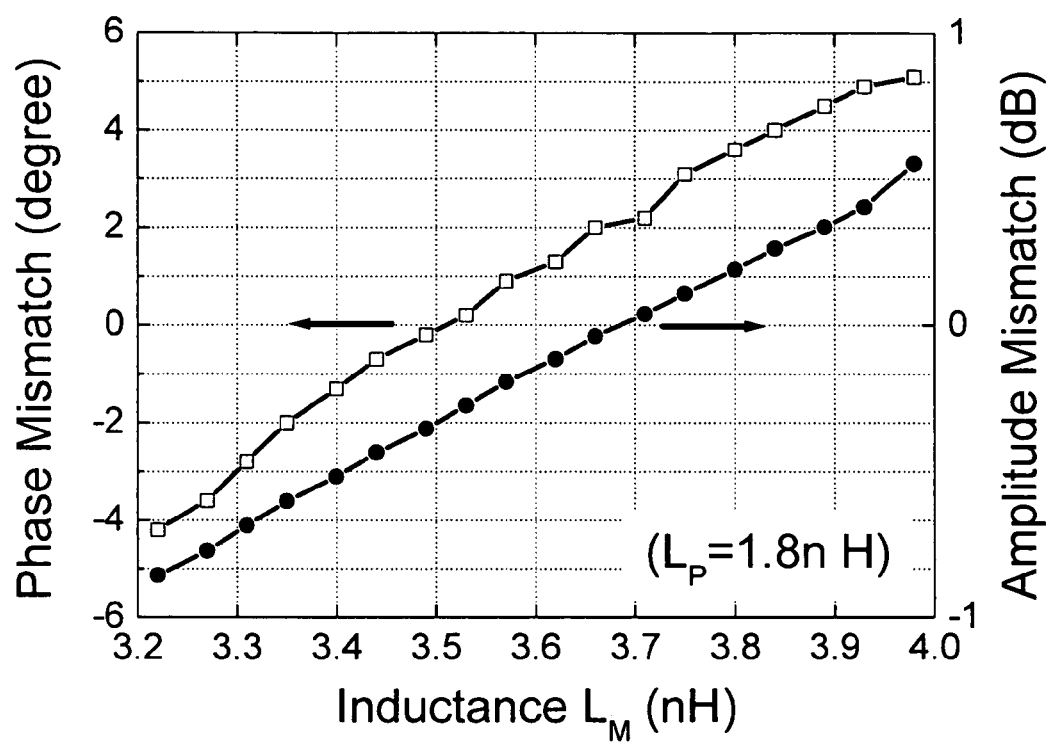
FIG. 6 is a diagram illustrating the amplitude mismatch and phase mismatch of differential output signals due to the impedance element of the push-push voltage controlled oscillator according to the present invention.
Figure 7A:
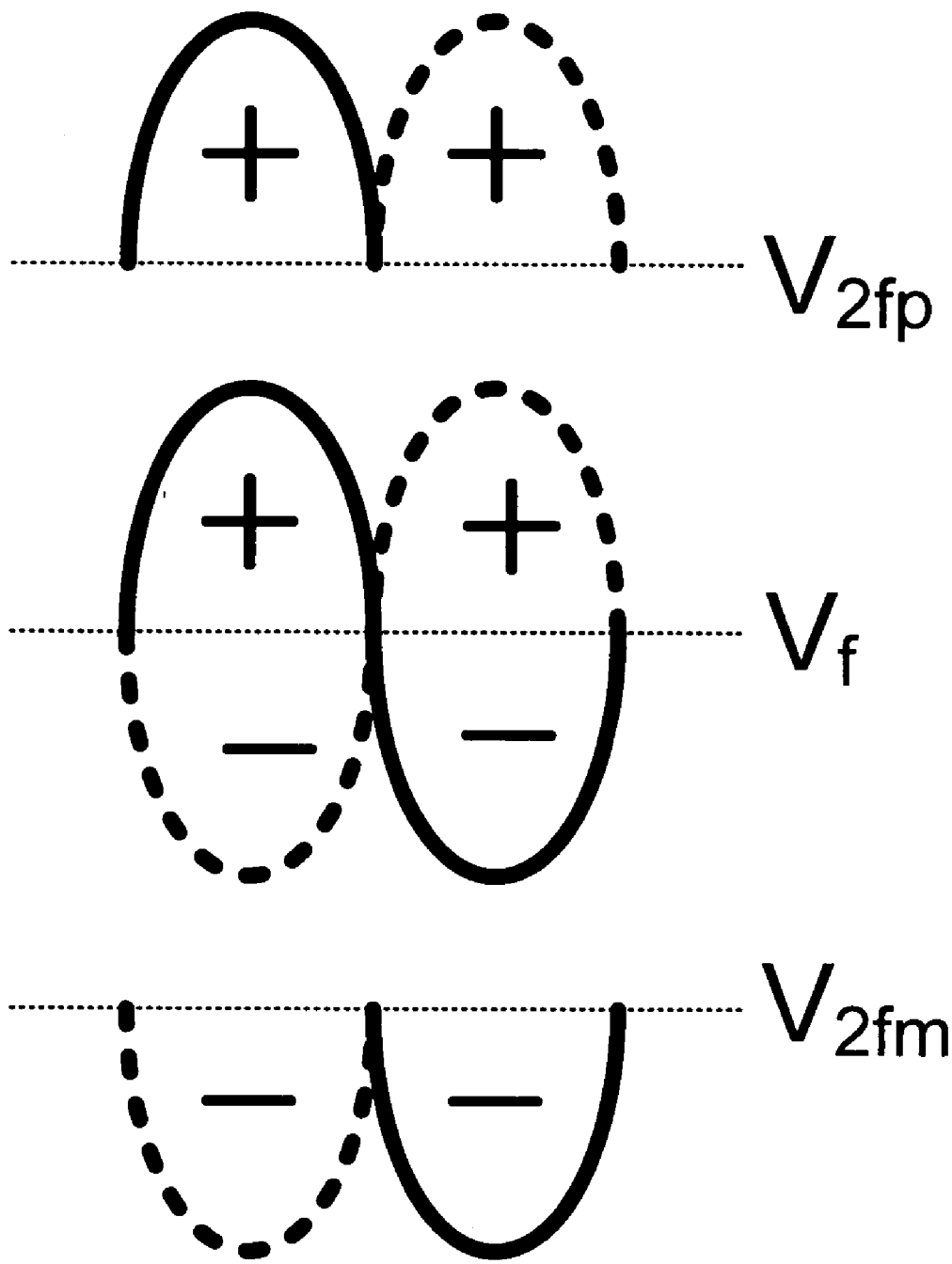
FIGS. 7A and 7B are diagrams illustrating the concept of waveforms of 2nd harmonic differential output signals according to the characteristic of the fundamental oscillation frequency signal of the push-push voltage controlled oscillator according to the present invention.
Figure 7B:
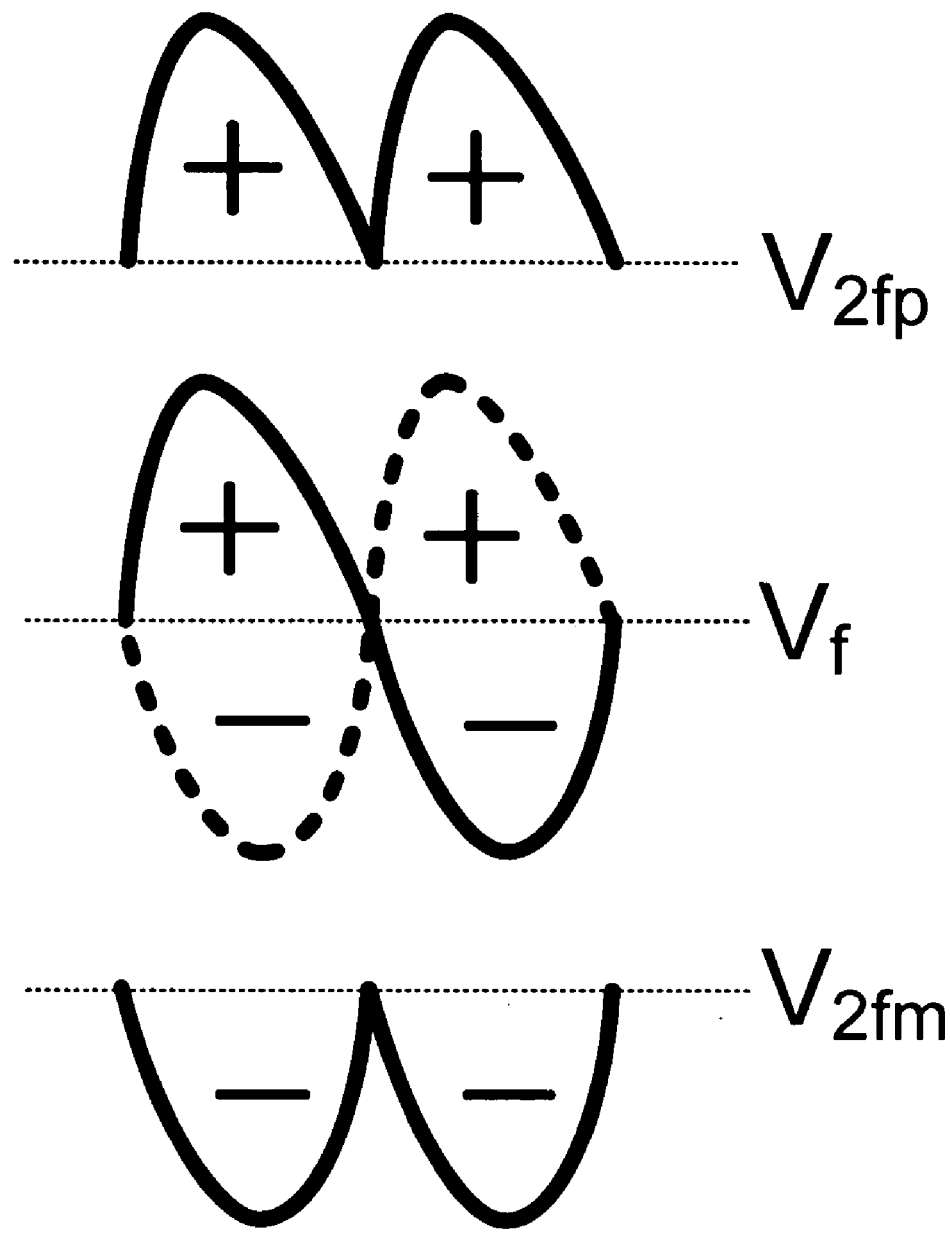
Figure 8:
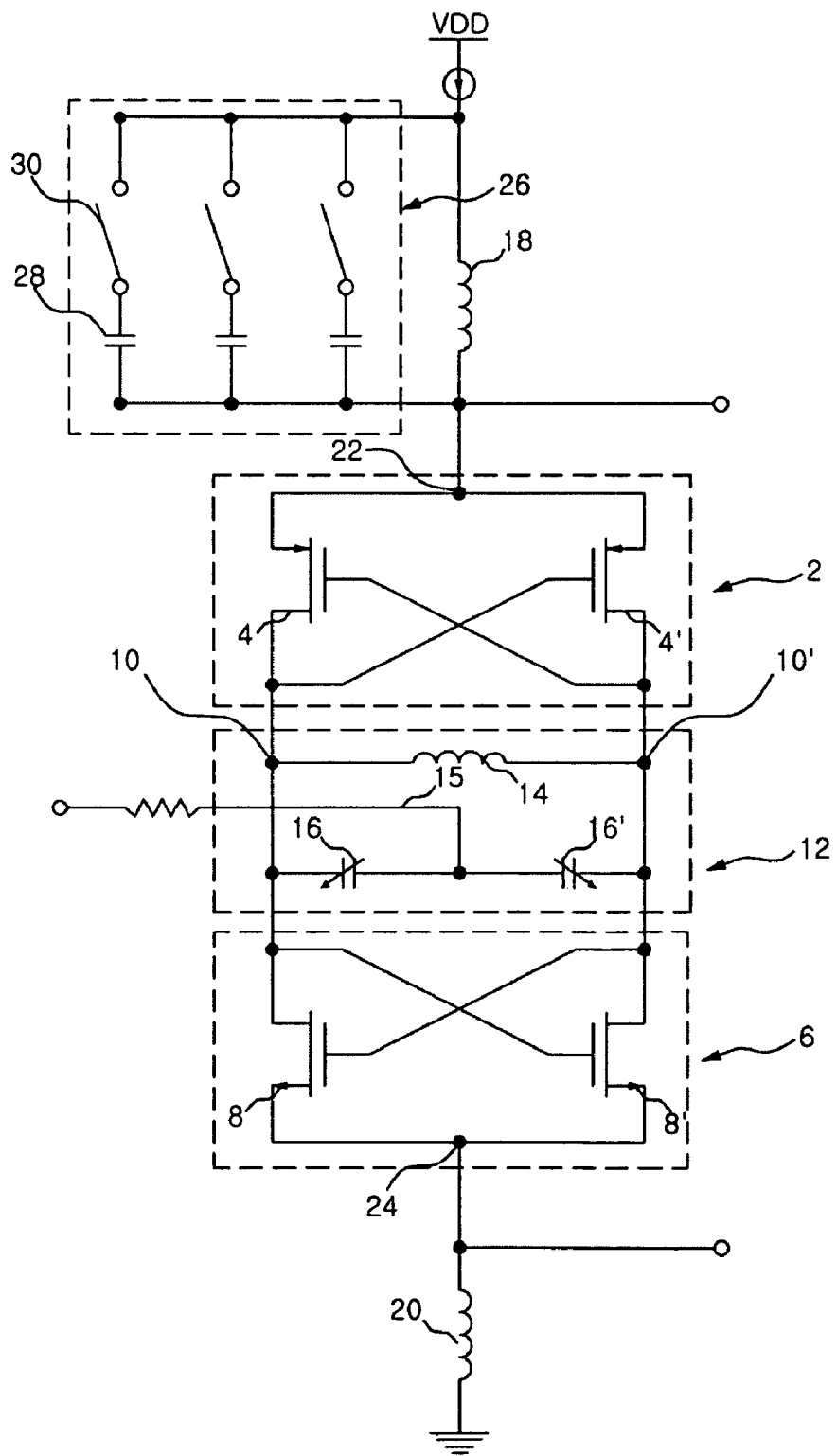
FIG. 8 is a diagram illustrating an example of implementing the impedance adjustment unit of the push-push voltage controlled oscillator according to the present invention.
Figure 9A:
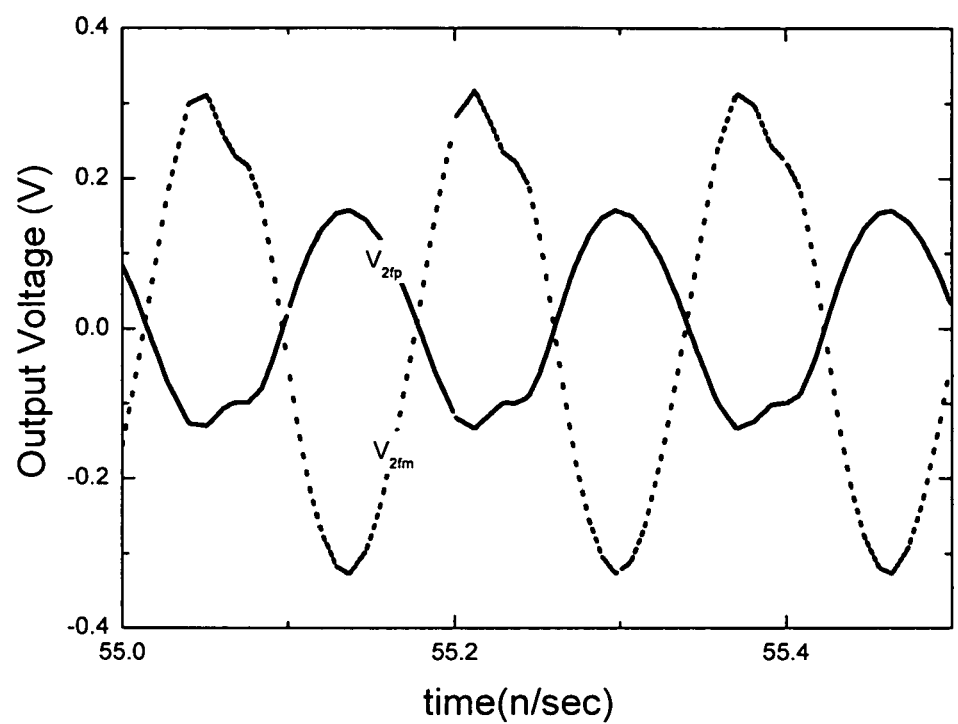
FIGS. 9A and 9B are diagrams illustrating the effects of the adjustment of capacitors of the push-push voltage controlled oscillator according to the present invention on the waveforms of differential outputs, respectively.
Figure 9B:
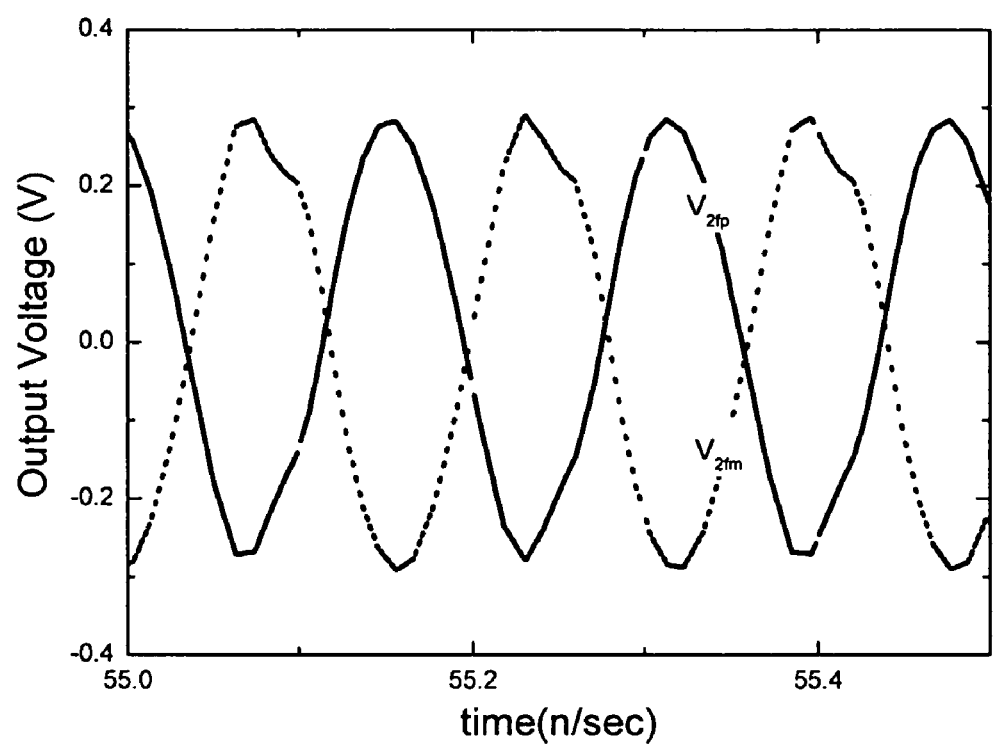
Figure 10A:
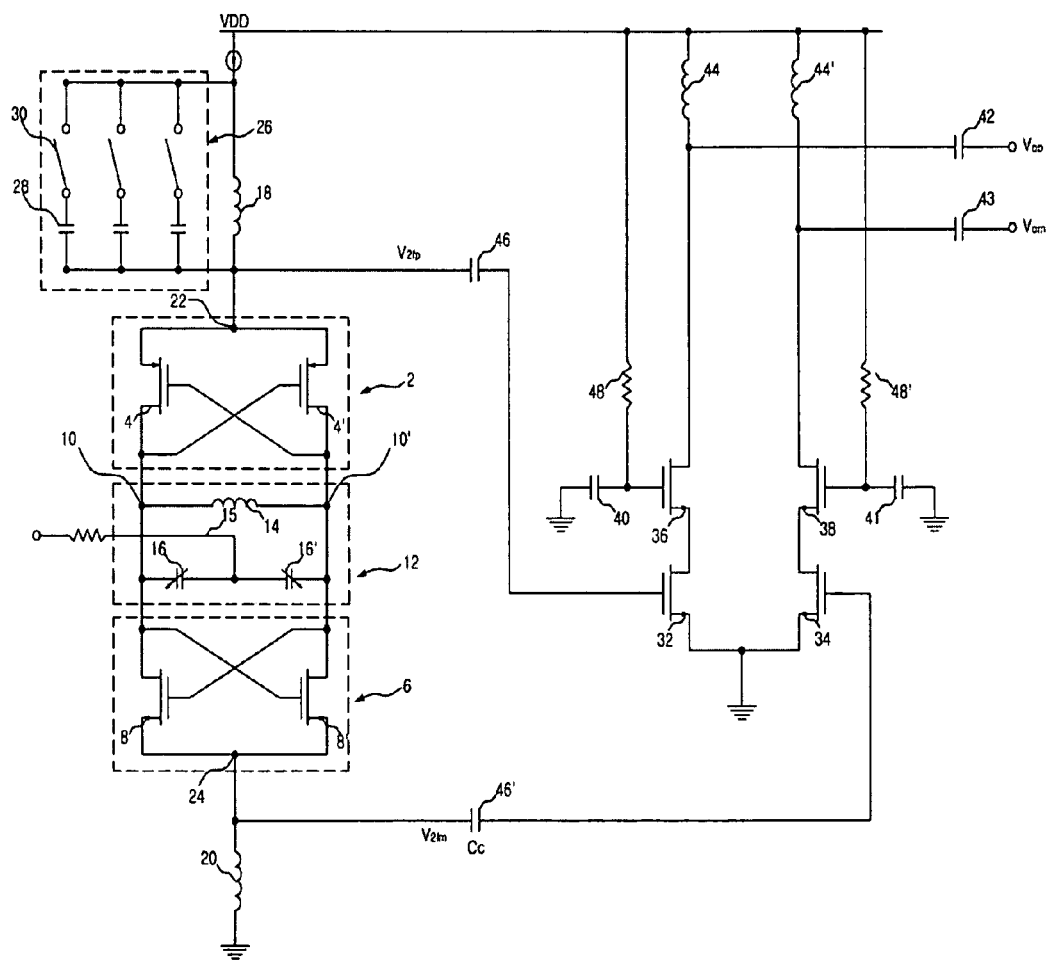
FIGS. 10A and 10B are diagrams illustrating the circuit of the push-push voltage controlled oscillator according to the present invention and the simulation waveforms thereof, respectively.
Figure 10B:
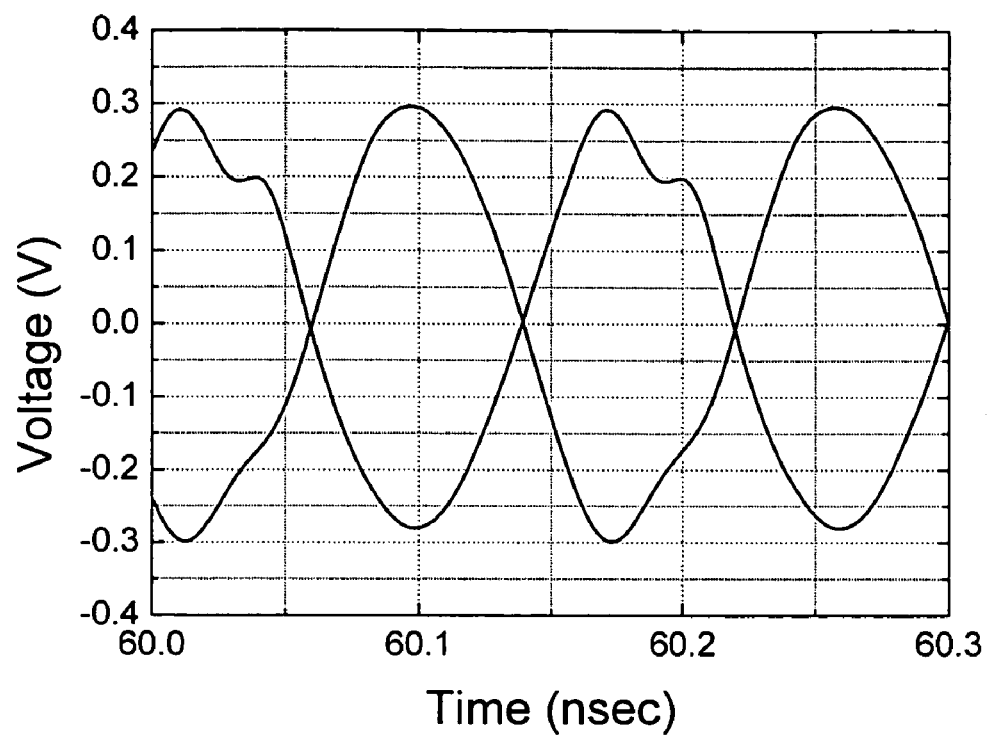
Figure 11:
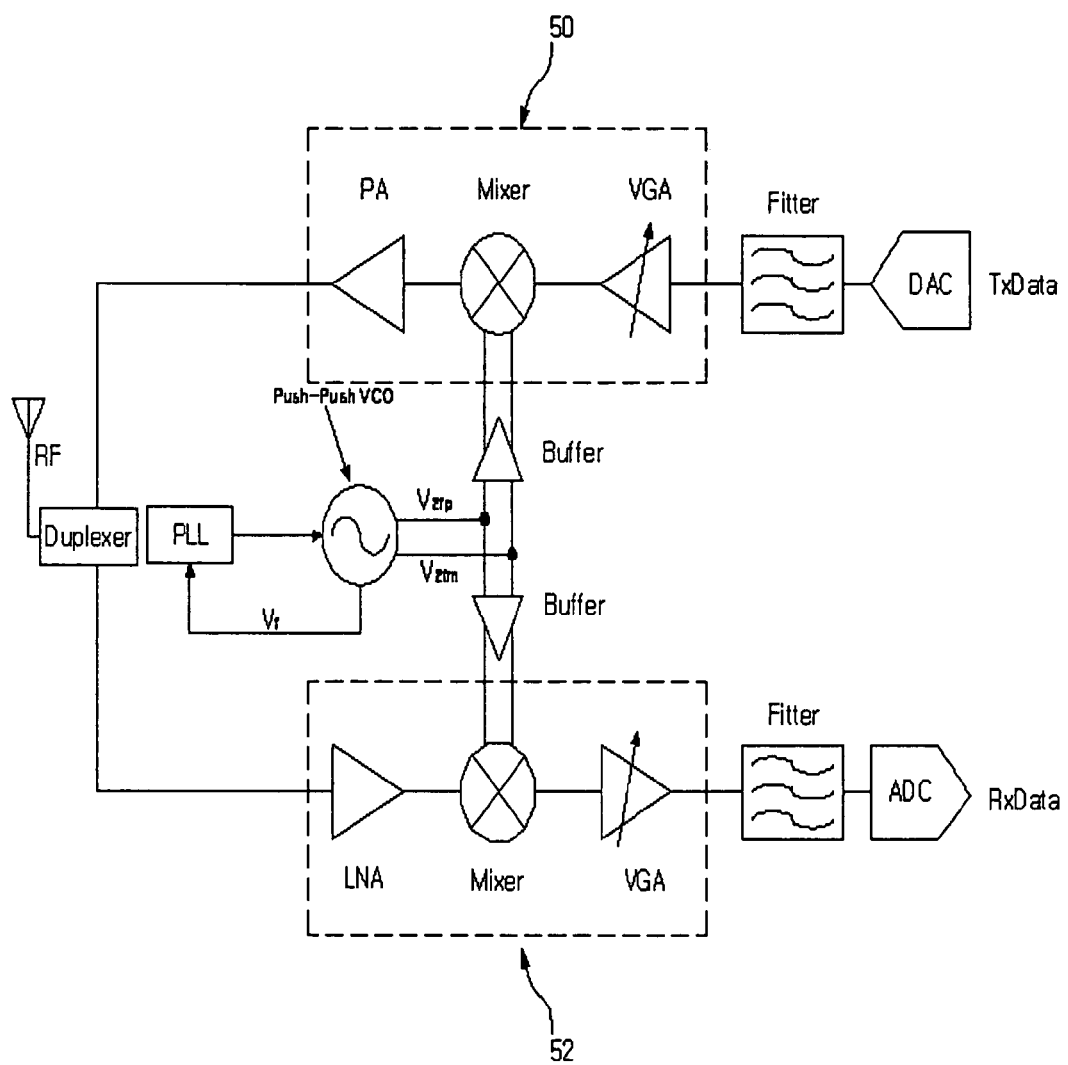
FIG. 11 is a diagram illustrating an example of implementing an RF transceiver using the push-push voltage controlled oscillator according to the present invention.

FIG. 3A and 3B are diagrams illustrating the structure of a push-push voltage controlled oscillator according to the present invention, FIGS. 4A and 4B are diagrams illustrating conceptual operation and simulated signal waveforms when the tank swing of the push-push voltage controlled oscillator according to the present invention is small, respectively, FIGS. 5A and 5B are diagrams illustrating conceptual operation and simulated signal waveforms when the tank swing of the push-push voltage controlled oscillator according to the present invention is large, respectively, FIG. 6 is a diagram illustrating the amplitude mismatch and phase mismatch of differential output signals due to the impedance element of the push-push voltage controlled oscillator according to the present invention, FIGS. 7A and 7B are diagrams illustrating the concept of waveforms of 2nd harmonic differential output signals according to the characteristic of the fundamental oscillation frequency signal of the push-push voltage controlled oscillator according to the present invention, FIG. 8 is a diagram illustrating an example of implementing the impedance adjustment unit of the push-push voltage controlled oscillator according to the present invention, FIGS. 9A and 9B are diagrams illustrating the effects of the adjustment of capacitors of the push-push voltage controlled oscillator according to the present invention on the waveforms of differential outputs, respectively, FIGS. 10A and 10B are diagrams illustrating the circuit of the push-push voltage controlled oscillator according to the present invention and the simulation waveforms thereof, respectively; and FIG. 11 is a diagram illustrating an example of implementing an RF transceiver using the push-push voltage controlled oscillator according to the present invention, with reference to which the present invention is described below.

As illustrated in FIGS. 3A, a push-push voltage controlled oscillator according to the present invention includes an LC resonance unit 12 for determining a fundamental oscillation frequency, a first negative resistance generation means 2 connected to the LC resonance unit 12 and configured to generate negative resistance and deliver an output signal to a first common source terminal 22, a first impedance element 18 for controlling the output signal of the first common source terminal 22, a second negative resistance generation means 6 connected to the LC resonance unit 12 and configured to generate negative resistance and deliver an output signal to a second common source terminal 24, and a second impedance element 20 for controlling the output signal of the second common source terminal 24.

In more detail, the push-push voltage controlled oscillator includes the LC resonance unit 12 for determining a fundamental oscillation frequency, the first negative resistance generation means 2 connected to the first terminal 10 and second terminal 10' of the LC resonance unit 12 and configured to generate negative resistance and deliver an output signal to the first common source terminal 22; the first impedance element 18 connected at one end thereof to the common source terminal 22 of the first negative resistance generation means and at the other end thereof to the power supply VDD, the second negative resistance generation means 6 connected to the first terminal 10 and second terminal 10' of the LC resonance unit 12 connected in series to the first negative resistance generation means 2 and configured to generate negative resistance and deliver an output signal to the second common source terminal 24, and the second impedance element 20 connected at one end thereof to the common source terminal 24 of the second negative resistance generation means 6 and at the other end thereof to a ground terminal.

The LC resonance unit 12 according to the present invention, which determines a fundamental oscillation frequency, includes an inductor 14 connected between the first terminal 10 and the second terminal 10' which connect the first negative resistance generation means 2 to the second negative resistance generation means 6, and first and second variable capacitance diodes 16 and 16' connected between the first terminal 10 and the second terminal 10' and connected in parallel to the inductor 14. In this case, a terminal formed between the first and second variable capacitance diodes 16 and 16' is connected to a frequency tuning voltage 15 to allow the voltage to be varied by an external device.

The first negative resistance generation means 2 according to the present invention includes PMOS FETs 4 and 4' cross-connected to generate negative resistance in order to compensate for the loss of the LC resonator 12, and receives oscillation signals from the first terminal 10 and the second terminal 10' of the LC resonator 12 and delivers an output signal to the first common source terminal 22. Preferably, the first negative resistance generation means 2 is constructed such that the drain of the first PMOS FET 4 is connected to the gate of the second PMOS FET 4' and the drain of the second PMOS FET 4' is connected to the gate of the first PMOS FET 4.

The second negative resistance generation means 6 according to the present invention includes NMOS FETs 8 and 8' cross-connected to generate negative resistance in order to compensate for the loss of the LC resonator 12, and receives oscillation signals from the first terminal 10 and the second terminal 10' of the LC resonator 12 and delivers an output signal to the second common source terminal 24. Preferably, the second negative resistance generation means 6 is constructed such that the drain of the first NMOS FET 8 is connected to the gate of the second NMOS FET 8' and the drain of the second NMOS FET 8' is connected to the gate of the first NMOS FET 8.

The first impedance element 18 according to the present invention is connected at one end thereof to the common source terminal 22 of the first negative resistance generation means 2 and at the other end thereof to the power supply VDD, controls the output signal of the first common source terminal 22, and is implemented using an inductor.

The second impedance element 20 according to the present invention is connected at one end thereof to the common source terminal 22 of the first negative resistance generation means 2 and at the other end thereof to the ground terminal, controls the output signal of the second common source terminal 24, and is implemented using an inductor.

In this case, as illustrated in FIG. 3B, the first impedance element 18 and the second impedance element 20 can be combined to each other in a transformer form such that the corresponding signals are coupled in opposite phase, so that the output signals from the respective impedance elements can become more accurate differential signal.

When the voltage controlled oscillator according to the present invention operates, differential outputs are realized at the first terminal 10 and the second terminal 10'. At this time, the upper and lower common source terminals (the first common source terminal of the PMOS FETs is referred to as a 'P terminal', while the second common source terminal of the NMOS FETs is referred to as an 'M terminal') of the PMOS FETs 4 and 4' and the NMOS FETs 8 and 8' acquire output signals, that is, a first output voltage signal (hereinafter referred to as "$V_{2fp}$") and a second output voltage signal (hereinafter referred to as "$V_{2fm}$"), which are the 2nd harmonics of a first oscillation voltage signal (hereinafter referred to as "$V_{fp}$") and a second oscillation voltage signal (hereinafter referred to as "$V_{fm}$"). In this case, $V_{2fp}$ and $V_{2fm}$, generated in the P terminal 22 and the M terminal 24, are differential signals, the phase mismatch between which is 180 degrees and the amplitudes of which are the same.

There are two modes in the generation of the $2^{nd}$ harmonic signal at the P terminal 22 and the M terminal 24 depending on the operating mechanism thereof. In this case, since the PMOS FET-related signal waveform of the voltage controlled oscillator is based on the same principle as the NMOS FET-related signal waveform, and is symmetrical to the other waveform, the following description is given only in conjunction with the NMOS FET.

A first mode is a source follow operation mode. As illustrated in FIG. 4A, transistors 8 and 8' alternately operate as a source follow amplifier or are turned off depending on the input voltage of a gate. At this time, the signal waveform of "$V_{2fm}$" following the half-cycle +regions of "$V_{fp}$" and "$V_{fm}$" is generated depending on a transistor operating as a source follow transistor, and "$V_{2fp}$" is generated from the PMOS FETs 4 and 4'.

In order to prove this, a 3 GHz voltage controlled oscillator circuit was designed using a 0.18 μm CMOS process as illustrated in FIG. 3A, and SPICE simulation was performed. FIG. 4B is a diagram illustrating simulated signal waveforms which represent the signal waveform of $V_{2fm}$, following the half-cycle +regions of $V_{fp}$ and $V_{fm}$ and, in contrast, represent the signal waveform of $V_{2fp}$ following the half-cycle −regions of $V_{fp}$ and $V_{fm}$. At this time, it must be noted that the signal waveforms illustrated in FIG. 4B occur when the amplitudes of $V_{fp}$ and $V_{fm}$ are lower than that of the gate-source bias voltage of each transistor. In this case, $V_{2fp}$ and $V_{2fm}$ are signals similar to differential signals.

A second mode according to the present invention is performed when the amplitude of an LC tank increases and then the amplitudes of $V_{fp}$ and $V_{fm}$ are higher than that of the gate-source bias voltage. $V_{2fm}$ is represented as a doubled operating frequency because part of the −regions of $V_{fp}$ and $V_{fm}$ alternatively appear at the terminal M 24 as illustrated in FIG. 5A. FIG. 5B is a diagram illustrating the signal waveforms resulting from the simulation of $V_{fp}$, $V_{fm}$, $V_{2fp}$ and $V_{2fm}$ for the 3 GHz voltage controlled oscillator circuit designed using 0.18 μm CMOS process as in FIG. 3A. In this drawing, +regions and −regions of $V_{fp}$ and $V_{fm}$ are represented in $V_{2fp}$ and $V_{2fm}$. At this time, $V_{2fp}$ and $V_{2fm}$, are very precise differential signals.

Comparing FIG. 4B with FIG. 5B, it is appreciated that relatively precise differential signals are generated in the second mode according to the present invention rather than the first mode. The reason for this is that the PMOS FETs 4 and 4' and NMOS FETs 8 and 8' generate $V_{2fp}$ and $V_{2fm}$, using a relatively unbalanced source follow operation in the first mode, but differential $V_{fp}$ and $V_{fm}$ generated by the voltage controlled oscillator directly form $V_{2fp}$ and $V_{2fm}$ in the second mode.

As described above, the push-push voltage controlled oscillator generates differential signals, for example, $V_{2fp}$ and $V_{2fm}$ that are two times $V_{fp}$) and $V_{fm}$, using the same.

The common source terminals 22 and 24 according to the present invention are used as terminals for generating an output signal. Generally, since the common source terminals 22 and 24 act as a virtual ground when being used in a differential circuit, low output signals are generated at the common source terminals 22 and 24. As a result, in order to increase the low outputs generated at the P terminal 22 and M terminal 24, a device for increasing impedances thereof must be included, and, preferably, the first and second impedance elements 18 and 20 may be implemented using inductors.

Meanwhile, the impedances of the first and second output voltages vary depending on inductance values, and, therefore, the amplitudes of $V_{2fp}$ and $V_{2fm}$ and phase mismatch therebetween may vary. In order to examine this, amplitude mismatch and phase mismatch due to the first and second impedance elements 18 and 20 was simulated, so that the inductor of the first impedance element 18 is set to 1.8 nH, and the inductor of the second impedance element 20 is set from 3.2 nH to 4.0 nH, the resultant values of which are shown in FIG. 6. That is, FIG. 6 illustrates the tendency in which amplitude mismatch and phase mismatch vary depending on the values of the first and second impedance elements.

Generally, a passive component is known to have a process tolerance rate of ±5%. Therefore, when the inductor of the second impedance element 20 has a tolerance of 3.2 nH to 4.0 nH according to the tolerance rate, the phase thereof varies by about ±5 degrees, and the amplitude mismatch thereof is maintained within 1.0 dB As described above, the push-push voltage controlled oscillator according to the present invention obtains differential signals of the first and second output voltages using differential signals of the first and second oscillation voltages at the common source terminals 22 and 24 of the voltage controlled oscillator. At this time, in order to be perfect differential signals for the first and second output voltages, the first and second oscillation voltages must be formed such that the signal waveforms of $V_{fp}$ and $V_{fm}$ are symmetrical with each other. FIG. 7A illustrates the signal waveform of $V_f$, composed of differential $V_{fp}$ and $V_{fm}$, and signal waveforms of $V_{2fp}$ and $V_{2fm}$ obtained from this. A doubled frequency, generated by combining half-cycles of $V_{fp}$ and $V_{fm}$ is divided into a positive region $V_{2fp}$ and a negative region $V_{2fm}$. As a result, it will be appreciated that $V_{2fp}$ and $V_{2fm}$ are perfect differential signals formed so as to be symmetrical with each other.

Meanwhile, when the two signals of the fundamental frequency $V_f$ are asymmetrical because the rising times and falling times are different and, therefore, the peak times thereof are not matched with each other, as illustrated by the fundamental signal $V_f$ in FIG. 7B, $V_{2fp}$, representing the positive region of the fundamental signal $V_f$, and $V_{2fm}$, representing the negative region of the fundamental signal $V_f$, do not form differential signals. The reason for this is that the peak times of the signals $V_{fp}$ and $V_{fm}$ are different, so that the peak times of the signals $V_{2fp}$ and $V_{2fm}$ are different. That is, in order to be perfect differential signals for $V_{2fp}$ and $V_{2fm}$, the signal waveform of the fundamental frequency $V_f$ must be a perfect differential signal as illustrated in FIG. 7A. As a result, in order to obtain differential signals $V_{2fp}$ and $V_{2fm}$, according to the present invention, it is important to construct a circuit such that $V_{2fp}$ and $V_{2fm}$ are balanced.

As described above, impedance values vary depending on the values of the first and second impedance elements 18 and 20, and errors of amplitudes and phases of $V_{2fp}$ and $V_{2fm}$ are generated. Therefore, the first and second impedance elements 18 and 20 are determined to minimize the errors of amplitude and phase. However, since the impedance values may vary depending on external conditions, such as capacitance and resistance due to a parasitic component and/or process tolerance, the errors can be corrected by adjusting the inductance values of the first and/or second impedance elements 18 and 20. For this purpose, as illustrated in FIG. 8, an impedance adjustment unit 26 may be connected to the first impedance element 18.

The impedance adjustment unit 26 compares amplitude and phase mismatch at the first common source terminal 22 with those at the second common source terminal 24, and adjusts the impedance of the first or second impedance element 18 or 20 or overall impedances thereof The impedance adjustment unit 26 is connected in series or, preferably, in parallel to the first impedance element 18. Furthermore, the impedance adjustment unit 26 may be constructed to automatically compare amplitudes and phase mismatchs and adjust the impedances.

In this case, the impedance adjustment unit 26 includes one or more capacitors 28 and switches 30 connected to the capacitors 28 to selectively turn on or off the capacitors 28. The capacitors 28 are connected in series, in parallel, or in an arrangement having both serial and parallel connections. At this time, the values of the capacitors 28 connected in parallel are changed by operating switches 30, so that the equivalent impedance value at the terminal 22 is also changed, thereby adjusting the amplitude and phase of $V_{2fp}$.

As a result, the signals of $V_{2fp}$ and $V_{2fm}$ are adjusted to be perfect differential signals. Furthermore, when the impedance adjustment unit 26 is connected to the second impedance element 20, the impedance at the terminal 24 can be adjusted, like the first impedance unit 18.

That is, the impedance adjustment unit 26 is connected to the first impedance element 18, the second impedance element 19, or both of them, so that the amplitudes and phase errors of $V_{2fp}$ and $V_{2fm}$ can be eliminated.

FIG. 9A is a diagram illustrating the change in the signal waveform $V_{2f}$ in the case in which the capacitors 28 are not adjusted, and FIG. 9B is a diagram illustrating the change in the signal waveform $V_{2f}$ in the case in which the capacitors 28 are adjusted. That is, it will be appreciated that the amplitude and phase error of $V_{2fp}$ change depending on the values of the capacitors 28.

Therefore, the change in impedance which is generated by process tolerance or other conditions are corrected by adjusting the capacitors 28, so that $V_{2fp}$ and $V_{2fm}$, having a doubled frequency of a fundamental frequency, can be obtained as perfect differential signals at the common source terminals 22 and 24.

FIG. 10A is a circuit diagram illustrating a push-push voltage controlled oscillator obtaining differential output signals in COMS technology.

The push-push voltage controlled oscillator circuit is constructed such that output signals $V_{op}$ and $V_{om}$ are measured using a buffer amplifier provided to measure differential signals $V_{2fp}$ and $V_{2fm}$ from the push-push voltage controlled oscillator illustrated in FIG. 8.

In this case, the buffer amplifier has a cascode amplifier structure and includes a third NMOS FET transistor 32, a fourth NMOS FET transistor 34, a fifth NMOS FET transistor 36, a sixth NMOS FET transistor 38, capacitors 40, 41, 42 and 43, a first inductor 44, and a second inductor 44'.

The drain of the fifth NMOS FET 36 is connected to the first inductor 44 connected to a power supply VDD, the source of the fifth NMOS FET 36 is connected to the drain of the third NMOS FET 32, and the gate of the fifth NMOS FET 36 is connected to the first capacitor 40 connected to a ground terminal. Furthermore, the gate of the fifth NMOS FET 36 is connected to a first resistor 48 connected to the power supply VDD, and the drain of the fifth NMOS FET 36 is connected to the third capacitor 42.

The gate of the third NMOS FET 32 is connected to a first coupling capacitor 46 connected to a first common source terminal 22. The source of the third NMOS FET 32 is connected to the source of the fourth NMOS FET 34. Furthermore, the common source terminal of the third and fourth NMOS FET 32 and 34 is connected to the ground terminal.

The gate of the fourth NMOS FET 34 is connected to a second coupling capacitor 46' connected to a second common source terminal 24, and the drain of the fourth NMOS FET 34 is connected to the source of the sixth NMOS FET 38.

The gate of the sixth NMOS FET 38 is connected to the second capacitor 41 connected to the ground terminal, the drain of the sixth NMOS FET 38 is connected to the second inductor 44' connected to the power supply VDD, and the drain of the sixth NMOS FET 38 is connected to a fourth capacitor 43. Furthermore, a second resistor 48' connected to the power supply VDD is connected between the gate of the sixth NMOS FET 38 and the second capacitor 41.

FIG. 10B is a diagram illustrating the signal waveforms of $V_{2fp}$ and $V_{2fm}$ in the push-push voltage controlled oscillator circuit obtaining differential outputs by using RF CMOS technology, in which $V_{2fp}$ and $V_{2fm}$ are the signals after they pass through the coupling capacitors 46 and 46', and therefore the difference of the dc values of the signals $V_{2fp}$ and $V_{2fm}$ are removed.

As illustrated in FIG. 11, the push-push voltage controlled oscillator circuit can be used in a direct conversion type RF transceiver. In this case, the oscillation frequency of the push-push voltage controlled oscillator core is $f_o$ and a frequency supplied to mixers for frequency conversion is $2f_o$. In the direct conversion type RF transceiver, the voltage controlled oscillator connected to a phase locked loop is connected to first and second mixers, the first and second mixers are respectively in a transmission unit 50 and a reception unit 52, and the transmission unit 50 and reception unit 52 are connected to an antenna through a duplexer. In this case, the mixer refers to a circuit for frequency upcoversion or downconversion. Furthermore, the phase locked loop serves to precisely adjust the frequency of the voltage controlled oscillator, thereby adjusting the output frequency of the oscillator to a desired frequency.

The transmission unit 50 is constructed in a form such that a Variable Gain Amplifier (VGA), a mixer, and a Power Amplifier (PA), are connected and input signals are sequentially supplied thereto. The reception unit 52 is constructed in a form in which a Low Noise Amplifier (LNA), a mixer and a variable gain amplifier are sequentially connected.

In the direct conversion type RF transceiver, the first buffer amplifier for a local oscillator is connected to the mixer of the transmission unit, and the second buffer amplifier for a local oscillator is connected to the mixer of the reception unit.

Since intermediate frequencies are omitted in such a direct conversion manner, the structure of a transceiver is simplified. As a result, various types of Surface Acoustic Wave (SAW) filters and mixers can be omitted, so the reduction of manufacturing costs and the miniaturization of size, and one-chip integration of a system become possible. Furthermore, when a push-push voltage oscillator circuit is applied to the direct conversion manner, the operating frequency of the oscillator core is separated from radio frequencies, so that frequency interference therebetween decreases and, therefore, decreasing the pulling problem experienced with the voltage oscillator circuit, and thereby, channel selectivity in the receiver and the output spectrum quality in the transmitter is improved.

As described above, the present invention obtains output signals having a frequency two times the fundamental resonance frequency of an LC resonator in a form of differential signals having the same amplitude and opposite phases, so that advantages occur in that external noise can be effectively eliminated, high frequency differential outputs are obtained using a voltage controlled oscillator, and current consumption can be reduced because an additional circuit is not used.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A push-push voltage controlled oscillator, comprising:
   an LC resonance unit for determining a fundamental oscillation frequency;
   a first negative resistance generation means connected between a first terminal and a second terminal of the LC resonance unit and configured to generate negative resistance and deliver an output signal to a first common source terminal;
   a first impedance element connected at one end thereof to the first common source terminal of the first negative resistance generation means and at another end thereof to the power supply VDD;
   a second negative resistance generation means connected in series to the first terminal and second terminal of the LC resonance unit, which are connected to the first negative resistance generation means, and configure to generate negative resistance and deliver an output signal to a second common source terminal;
   a second impedance element connected at one end thereof to the second common source terminal of the second negative resistance generation means and at another end thereof to a ground terminal; and
   an impedance adjustment unit for adjusting the impedance of the first or the second impedance element, or the overall impedance of the first and second impedance elements,
   wherein the impedance adjustment unit is connected to the first impedance element, the second impedance element, or both of them, so that amplitude and phase errors of differential output signals produced from the first and/or second impedance element can be minimized by comparing an amplitude and a phase mismatch at the first common source terminal with those at the second common source terminal.

2. The push-push voltage controlled oscillator as set forth in claim 1, wherein the impedance adjustment unit comprises one or more capacitors and switches connected to the capacitors to selectively turn on or off the capacitors, and the capacitors are connected in parallel, in series, or in an arrangement having both serial and parallel connections.

3. A push-push voltage controlled oscillator, comprising:
   an LC resonance unit for determining a fundamental oscillation frequency;
   a first negative resistance generation means connected between a first terminal and a second terminal of the LC resonance unit and configured to generate negative resistance and deliver an output signal to a first common source terminal;
   a first impedance element connected at one end thereof to the first common source terminal of the first negative resistance generation means and at another end thereof to the power supply VDD;
   a second negative resistance generation means connected in series to the first terminal and second terminal of the LC resonance unit, which are connected to the first negative resistance generation means, and configured to generate negative resistance and deliver an output signal to a second common source terminal;

a second impedance element connected at one end thereof to the second common source terminal of the second negative resistance generation means and at another end thereof to a ground terminal; and an impedance adjustment unit for adjusting the impedance of the first or the second impedance element, or the overall impedance of the first and second impedance elements, wherein the first impedance element and the second impedance element are coupled to each other in a transformer form.

* * * * *